(12) United States Patent
Hsien

(10) Patent No.: US 6,976,306 B1
(45) Date of Patent: Dec. 20, 2005

(54) MODULAR METHOD FOR MANUFACTURING CIRCUIT BOARD

(75) Inventor: Chou Cheng Hsien, Chung-he (TW)

(73) Assignee: Unitech Printed Circuit Board Corporation, Taipei (TW)

( * ) Notice: Subject to any disclaimer, the term of this patent is extended or adjusted under 35 U.S.C. 154(b) by 0 days.

(21) Appl. No.: 10/887,858

(22) Filed: Jul. 12, 2004

(51) Int. Cl.$^7$ .............................................. H01K 3/10
(52) U.S. Cl. ........................... 29/852; 29/825; 29/830; 29/846; 427/97.5
(58) Field of Search .................... 29/825, 830, 846, 29/852; 427/97.5

(56) References Cited

U.S. PATENT DOCUMENTS 5,255,431 A * 10/1993 Burdick ..................... 29/840
6,139,904 A * 10/2000 Yamasaki et al. .......... 427/97.2

FOREIGN PATENT DOCUMENTS

| JP | 04-309291 | * 10/1992 |
| JP | 08-148805 | * 6/1996 |
| JP | 09-283881 | * 10/1997 |
| JP | 10-199934 | * 7/1998 |
| JP | 10-256313 | * 9/1998 |

* cited by examiner

Primary Examiner—Carl J. Arbes
(74) Attorney, Agent, or Firm—Bacon & Thomas, PLLC

(57) ABSTRACT

The present invention discloses a modular method for manufacturing circuit boards, which is a method of manufacturing multilayer printed circuit boards with blind and buried vias structure by using basic components as the assembly units. The method comprises the steps of producing electric circuits on the surface of a copper clad laminate by photolithographic and etching methods, pressing a dry film dielectric onto the surface of the laminate by the dry film lamination method after the electric circuit layer is formed, drilling a via and plugging a plastic conductive material into the via to obtain a basic component. When a multilayer printed circuit board having the blind and buried via structure is manufactured, the basic component serves as an assembling unit to stack with other circuit board having blind via and single-sided or double-sided electric circuits according to the multilayer circuit board mode to perform a heating and pressurization procedure and form a multilayer circuit board with blind and buried via structure. Such arrangement not only saves the time for aligning layers, pressing and blind via filled plating of the prior-art technology, but also enhances the yield rate and reduces the failure cost.

21 Claims, 9 Drawing Sheets

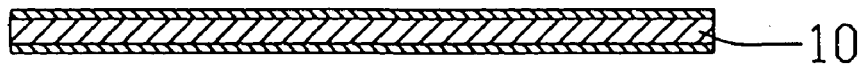
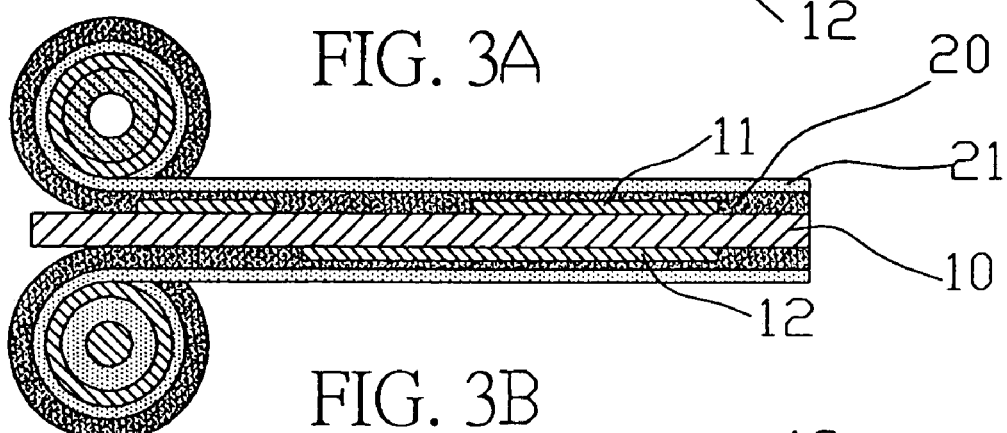
FIG. 3A
FIG. 3B
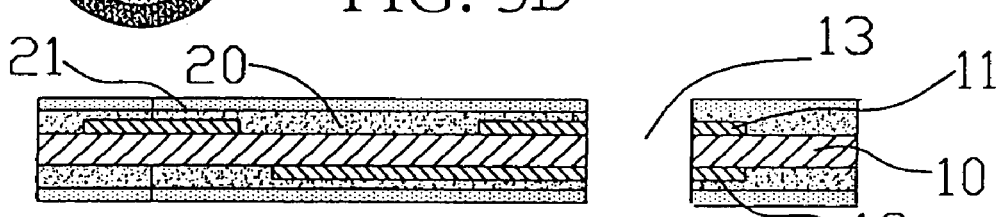
FIG. 3C
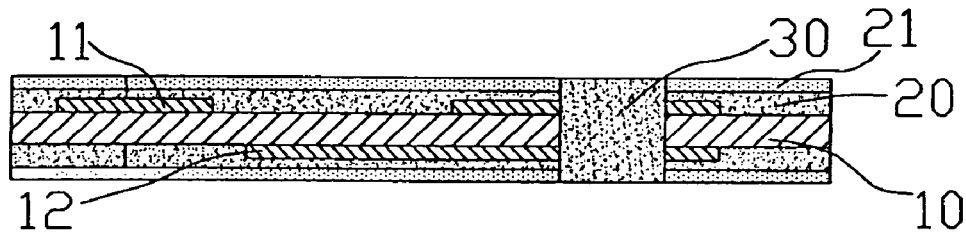
FIG. 3D
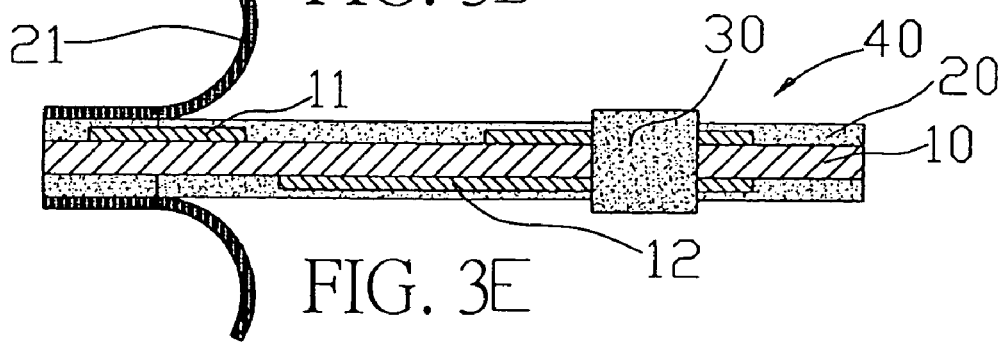
FIG. 3E

MODULAR METHOD FOR MANUFACTURING CIRCUIT BOARD

BACKGROUND OF THE INVENTION

1. Field of the Invention

The present invention relates to a modular method for manufacturing printed circuit boards, which is a method of manufacturing multilayer printed circuit boards with blind and buried vias structure by using basic components as the assembly units. The method adopts a dry film lamination method to press a dry film dielectric (i.e. a dielectric material in the form of a dry film, which is a semi-sticky plastic state) at B-stage (i.e. the stage of a resin before its reaching a glass conversion state) onto a laminate after the photolithography and etching processes are performed. Vias are drilled at appropriate positions on the upper and lower layers that require an electric connection, and then a plastic conductive material is filled into the vias to produce basic components. To comprise the basic components, circuit boards having blind vias and single-sided or double-sided circuits, the dielectric materials and the copper clads according to the required multilayer printed circuit board mode, then heating and pressurization process is performed once to form the multilayer printed circuit boards with blind and buried vias structure. Such arrangement not only saves the time for aligning layers, pressing and blind via filled plating of the prior-art technology, but also enhances the yield rate and reduces the failure cost.

2. Description of the Related Art

In the traditional printed circuit board manufacturing, the design of a single-sided or a double-sided inserted component and via is common at early stage. However, more and more functions are required for the electronic products and cause a demand for a high circuit density. The design of printed circuit boards tends to be a multilayer board design. The layout area is increased by having more layers of a printed circuit board, and the plating through hole (PTH) method is still adopted for electrically connecting the layers.

Since the plate through hole method for electrically connecting the layers will waste the layout real estate for the printed circuit board that does not need an electric connection between layers, therefore a high density interconnect (HDI) method by using a laser drilling method to electrically connect a layer with the next layer is adopted to overcome the aforementioned shortcoming. The high density interconnect method become a common method for manufacturing a multilayer circuit board that has a structure with blind vias (vias electrically interconnecting the outmost layer of the circuit board to the next layer or the layer next to the next layer) and buried vias (vias electrically interconnecting layers within the circuit board only, but not electrically interconnected to the outmost layer directly).

In the build up process by using the laser drilling method to produce blind vias layer by layer, a special chemical solution of a higher cost is used to fill plate the blind vias for long hours in order to stack the blind vias at the built up layer on the blind vias at the next layer (Stack Via) to save the real estate and increase the electric conduction reliability.

Please refer to FIGS. 1A to 1E for the illustrative views of the build up process and the flow of interconnecting the next layer according to a prior-art printed circuit board manufacturing technology. An electric circuit 110, 120 as shown in FIG. 1A is produced on a copper clad laminate 100 by photolithography and etching processes and a dielectric material 130 such as a resin-impregnated fiberglass fabric or a resin-impregnated short-fiber polyamide mat and copper clad 140 is deposited on the electric circuit 110 as shown in FIG. 1B. For laser drilling, carbon dioxide ($CO_2$) laser is generally used, and such laser can effectively burn the resin polymer layer of a circuit board, but cannot burn the metal layer of a circuit board. Therefore, it is necessary to use a photoresist agent to protect the metal layer 140 and expose the section that requires an electrical interconnect, and then etch the metal of the section 150 (this process is commonly known as "Conformal Window" process) as shown in FIG. 1C. Then, drill a via 160 by laser drilling as shown in FIG. 1D and plate a metal layer 170 on the sidewall of the via 160 as shown in FIG. 1E.

Please refer to FIGS. 2A to 2J for the illustrative views of the flow of producing an 8-layer printed circuit board having blind and buried vias structure according to a prior-art printed circuit board manufacturing technology.

An electric circuit 210, 220 as shown in FIGS. 2A and 2B is produced on a copper clad laminate 200 by photolithography and etching processes and a dielectric 230 such as a resin-impregnated fiberglass fabric or a resin-impregnated short-fiber polyamide mat and copper clad 240 is deposited on the electric circuit 210, 220 as shown in FIG. 2C, to perform a heating and pressurization process for a tight press as shown in FIG. 2D, and then perform mechanical drilling and plating operations to give an electrical connection function between the layers that require electrical interconnection. A conductive material 250 fills the vias by a silk screen printing method to allow stack via (blind vias stack on the buried vias) and increase the electric conduction reliability between new built-up layers. An electric circuit is produced on the outer layer by the photolithography and etching method. Therefore, the core 4-layer circuit structure of the 8-layer circuit board having blind and buried via structure is completed (as shown in FIG. 2E.)

And then, the build up process is carried out as follows:

A dielectric 230 and a metal clad 240 used for pressing are deposited on such a core 4-layer circuit structure (as shown in FIG. 2F), and the heating and pressurization process is performed once again for a tight press, and then the conformal window, laser drilling, via filled plating, photolithography and etching processes are performed to electrically connect the core 4-layer circuit structure and the new build up circuit layer to produce the blind via 260 and the electric circuit as shown in FIGS. 2G to 2H. Therefore, a core 6-layer circuit structure of the 8-layer circuit board having blind and buried via structure is completed.

Then, the build up process is performed once again.

A dielectric 230 and a metal clad 240 used for pressing are deposited on such a core 6-layer circuit structure, and the heating and pressurization process is performed for the third time for a tight press (as shown in FIG. 2I), and then the mechanical drilling, conformal window, laser drilling, via filled plating, photolithography and etching processes are performed to produce the blind via and the outermost electric circuit as shown in FIG. 2J. Therefore, an 8-layer circuit board having blind and buried vias is completed.

Similarly, a circuit board with more layers having the blind and buried via structure can be made by repeating the procedure above.

However, it is noteworthy that the plated metal can just be deposited along the sidewall of the via (as indicated by 170 in FIG. 1E) in traditional plating, and the blind via cannot be filled. Therefore, a special chemical solution of a very high cost is needed for the foregoing via filled plating to achieve the purpose of filling the via by plating.

Further, the prior-art technology requires a pressing process each time for adding a layer. Since each pressing can only confirms the alignment between a new circuit layer and its next circuit layer, therefore a serious deviation on the alignment between different circuit layers caused by the increased times of pressings will be resulted.

From the foregoing process, it is obvious that the prior-art process takes long time, not only is difficult to enhance the yield rate, but also increase the cost of fault at a later stage of the manufacturing process.

SUMMARY OF THE INVENTION

In view of the description above, the inventor of the present invention based on years of experience on the related field to conduct experiments and tests to overcome the aforementioned shortcomings of the prior art and finally invented the method for manufacturing a multilayer printed circuit board having blind and buried vias structure by using a basic component as the assembling unit in accordance with the present invention.

The primary objective of the present invention is to provide a method for manufacturing multilayer printed circuit boards with blind and buried vias structure by using basic components as the assembly units. The method comprises the steps of producing an electric circuit on the surface of a copper clad laminate by photolithographic and etching methods, pressing a dry film dielectric onto the surface of the laminate by the dry film lamination method after the electric circuit layer is formed, drilling a via by a mechanical drilling method and plugging a plastic conductive material into the via, then removing the coversheet (i.e. a polyester film) on the surface of the dry film dielectric to obtain a basic component. When a multilayer printed circuit board having the blind and buried via structure is manufactured, to comprise the basic components, circuit boards having blind vias and single-sided or double-sided circuits, the dielectric materials and the copper clads according to the required multilayer printed circuit board mode, then heating and pressurization process is performed once to form the multilayer printed circuit boards with blind and buried vias structure. So compare with the prior-art technology that needs layers aligning, pressing and use of special chemical solution for blind via filled plating in each time build up process, the present invention has the following advantages:

1. Whatever layer counts of multilayer circuit board having blind and buried vias structure, just only once heating and pressurization process is needed to complete the manufacture. The present invention can reduce the times of the heating and pressurization processes. (The prior-art technology requires at least two times of heating and pressurization processes depending on the layer counts of the circuit board structure, and each time takes about 4~5 hours).

2. The present invention provides an excellent alignment; since it only needs to go through the pressing process for one time, therefore the confirmation of the alignment between each circuit layer and its next layer can be done at one time to avoid a serious deviated alignment between the circuit layers caused by too many times of pressings.

3. The present invention does not need the special and high cost chemical solution to perform via-filled plating. The present invention directly fills plastic conductive material from the vias of basic components into the blind vias of circuit boards having blind vias and single-sided or double-sided circuits to achieve the same effect as the via-filled plating, and save much time and cost.

4. Unlike the prior-art technology that needs to make the circuit board layer by layer, continuously repeat build up process from the inner layers to the outer layers (heating and pressurization, mechanical drilling, laser drilling, via-filled plating . . . etc.), the present invention separately manufacture the basic components and the circuit boards having blind vias and single-sided or double-sided circuits then select the good ones to perform once heating and pressurization. So the present invention not only save the overall manufacturing time, but also enhance the yield rate and lower the cost of fault at a later stage of the manufacturing process.

BRIEF DESCRIPTION OF THE DRAWINGS

To make it easier for our examiner to understand the objective of the invention, its structure, innovative features, and performance, we use a preferred embodiment together with the attached drawings for the detailed description of the invention.

FIGS. 3A~3E are illustrative views of producing a basic component of the present invention.

DETAILED DESCRIPTION OF THE PREFERRED EMBODIMENTS

Figure 1A:
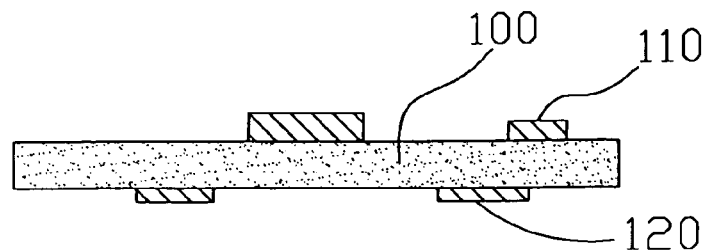
FIGS. 1A~1E are illustrative views of the build up process and the flow of interconnecting the next layer according to a prior-art printed circuit board manufacturing technology.
Figure 1B:
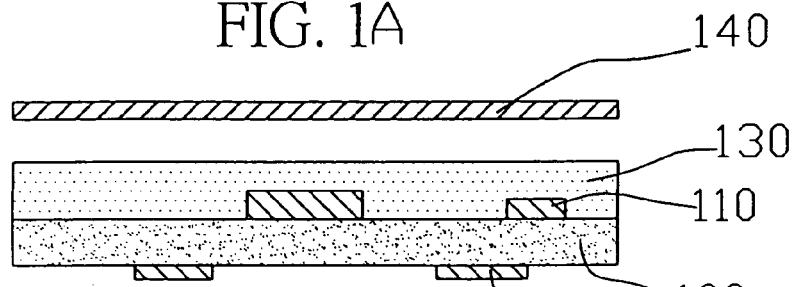
Figure 1C:
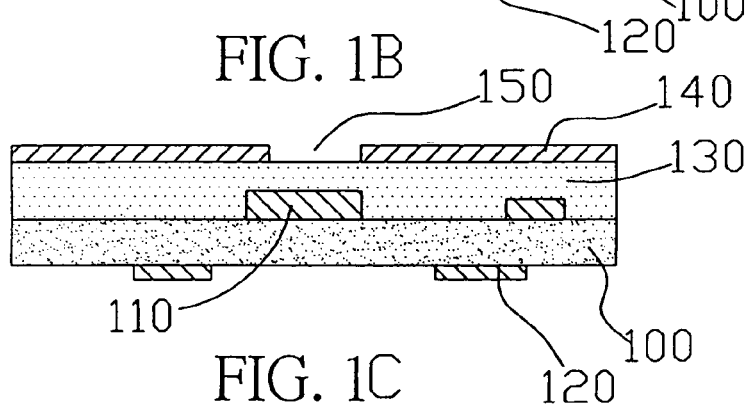
Figure 1D:
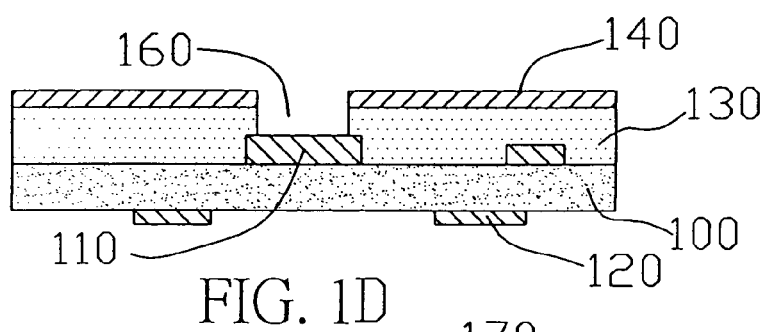
Figure 1E:
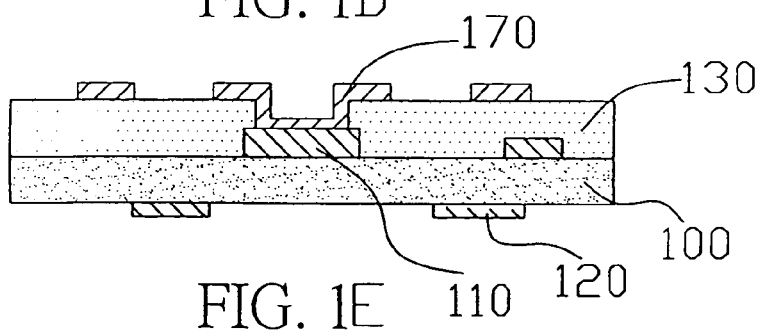
Figure 2A:
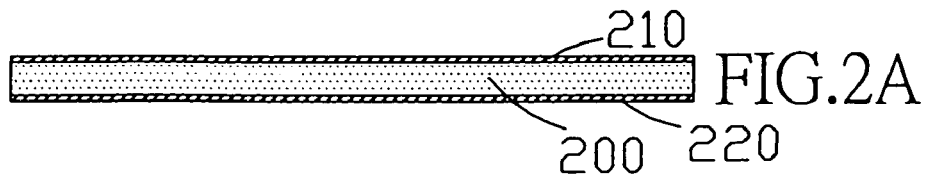
FIGS. 2A~2J are illustrative views of the flow of producing an 8-layer printed circuit board having blind and buried vias structure according to a prior-art printed circuit board manufacturing technology.
Figure 2B:
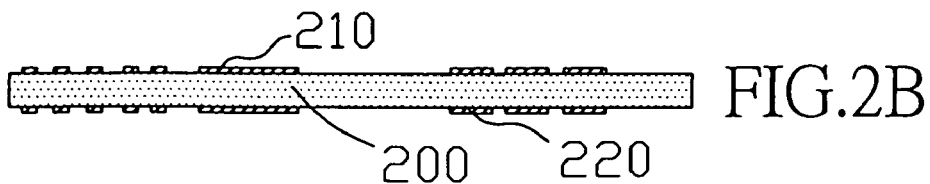
Figure 2C:
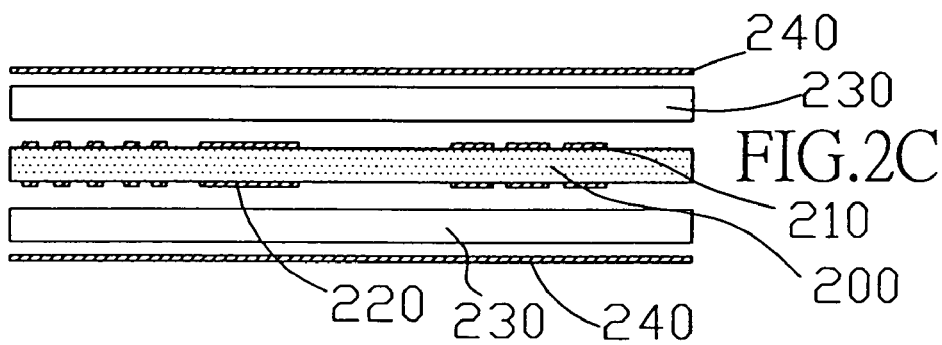
Figure 2D:
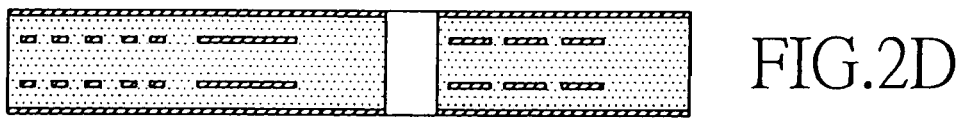
Figure 2E:
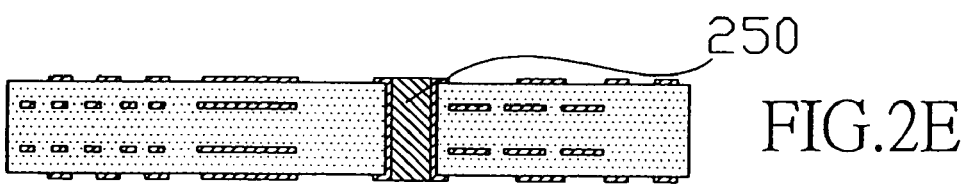
Figure 2F:
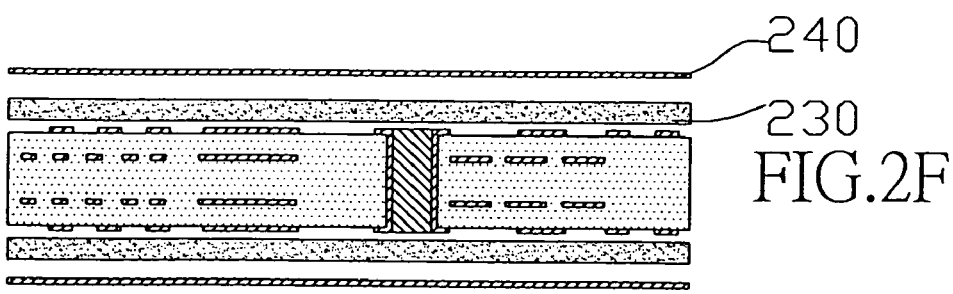
Figure 2G:
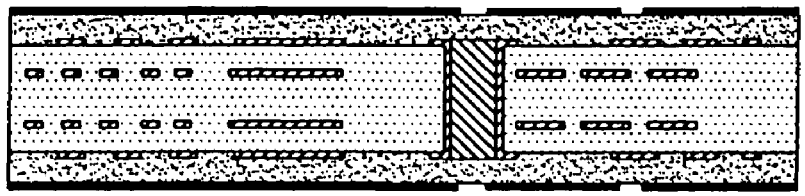
Figure 2H:
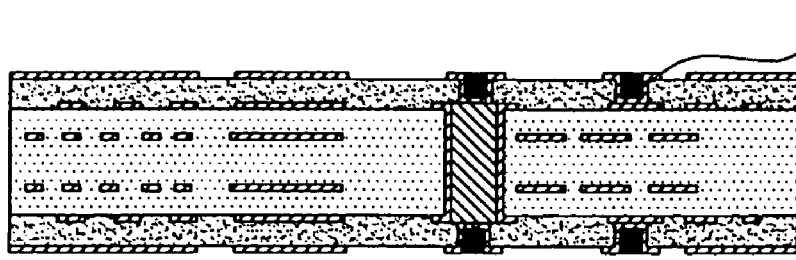
Figure 2I:
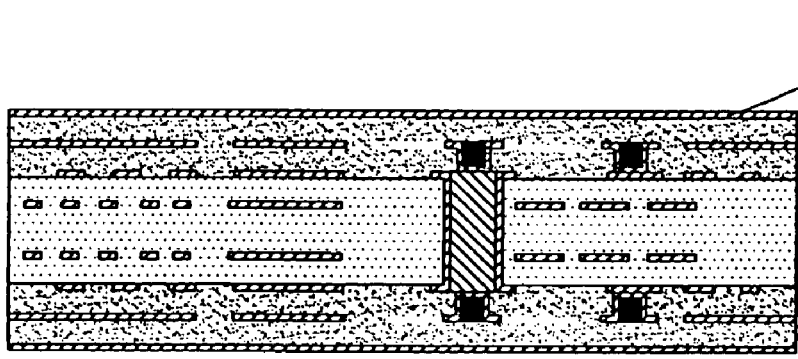
Figure 2J:
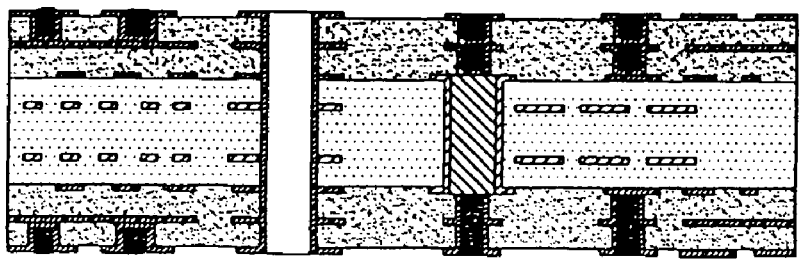

The present invention relates to a modular method for manufacturing circuit boards by using basic components as the assembling units to produce multilayer circuit boards having the blind and buried vias structure.

Please refer to FIGS. 3A to 3E for the illustrative views of producing a basic component of the present invention. The method comprises the steps of using an electric circuit manufacturing process to produce an electric circuit layer 11, 12 on the surface of a copper clad laminate 10 by photolithographic and etching methods (as shown in FIG. 3A); pressing a dry film dielectric 20 which at B-stage (i.e. the stage of a resin before its reaching a glass conversion state) and having a coversheet (i.e. a polyester film) onto the electric circuit layer 11, 12 by the dry film lamination method (as shown in FIG. 3B); and drilling vias 13 at predetermined position by mechanical drilling method (as shown in FIG. 3C) and plugging plastic conductive material 30 into the vias 13, and then removing the coversheet 21 on the surface of the dry film dielectric 20, so that the plastic conductive material 30 will be protruded slightly from the vias 13, such to obtain a basic component 40 (as shown in FIG. 3E).

Figure 4A:
FIGS. 4A~4D are illustrative views of producing a printed circuit board with the assembly and application of the basic components according to the present invention.
Figure 4A:
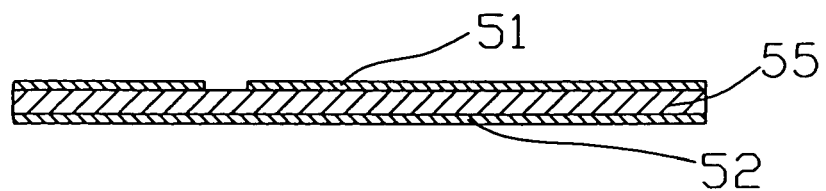
Figure 4B:
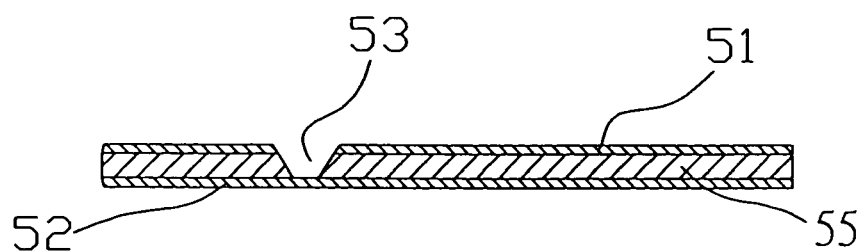
Figure 4C:
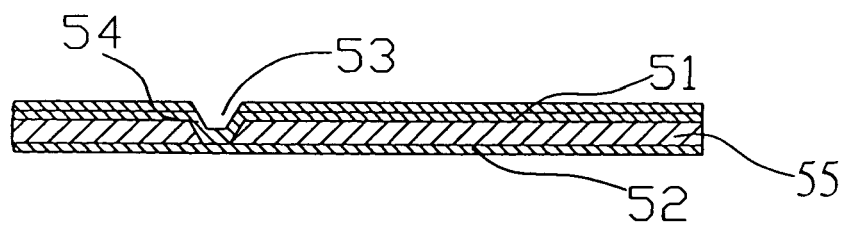
Figure 4D:
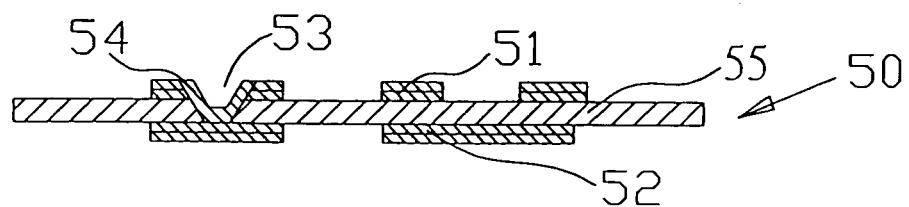

Further, please refer to FIGS. 4A to 4D for the illustrative views of producing a printed circuit board with the assembly and application of the basic components according to the present invention. The method comprises the steps of etching the surface of a copper clad laminate 55 to remove the metal at the position for producing laser vias (as shown in FIG. 4A), burning the resin to produce blind vias 53 by laser drilling method (as shown in FIG. 4B), plating a layer of metal 54 onto the surface of the blind via by plating method (as shown in FIG. 4C), and producing single-sided or double-sided circuits by the photolithography and etching processes (as shown in FIG. 4D) to obtain a circuit board component 50 having blind vias 53. The double-sided circuit board is used in this embodiment.

Figure 5A:
FIGS. 5A~5C are illustrative views of a 6-layer printed circuit board manufacturing procedure according to a first preferred embodiment of the present invention.
Figure 5B:
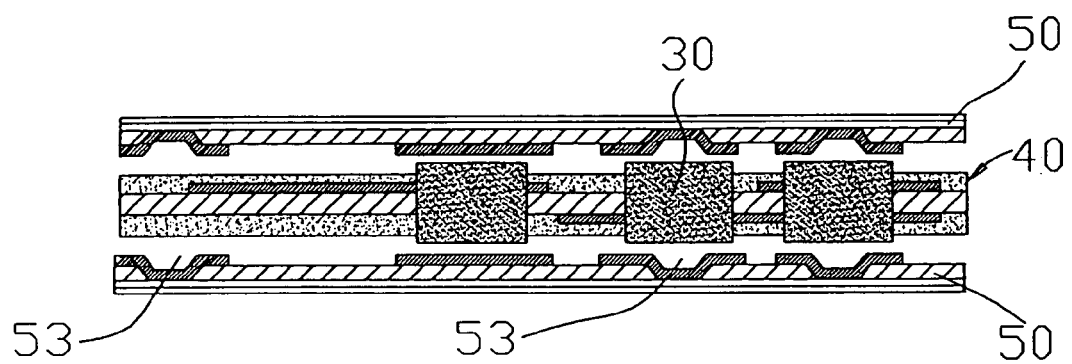
Figure 5C:
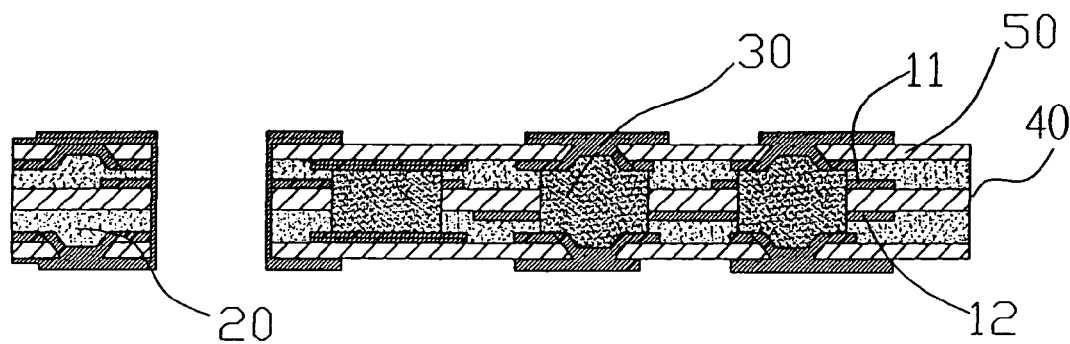

Please refer to FIGS. 5A to 5C for illustrative views of a 6-layer printed circuit board manufacturing procedure according to a first preferred embodiment of the present invention. To stack the circuit board component 50 having produced blind vias and single-sided electric circuit onto both the upper and lower sides of a basic component, and the produced electric circuit layer of the circuit board component 50 adjacent to the basic component 40. In the meantime, align the blind vias 53 of the circuit board component 50 needs to interconnect with the buried vias of the basic component 40 (as shown in FIGS. 5A and 5B), since the plastic conductive material 30 is slightly protruded from the opening of the via after the coversheet on the surface of the dry film dielectric is removed, therefore the plastic conductive material 30 will fill up the blind vias 53 when carrying out the heating and pressurization process. After the pressing process is completed, the mechanical drilling and plating are performed to produce the via interconnection, and produce the outmost electric circuit by the photolithography and etching methods, such the required 6-layer circuit board having blind and buried vias structure is completed (as shown in FIG. 5C).

Figure 6A:
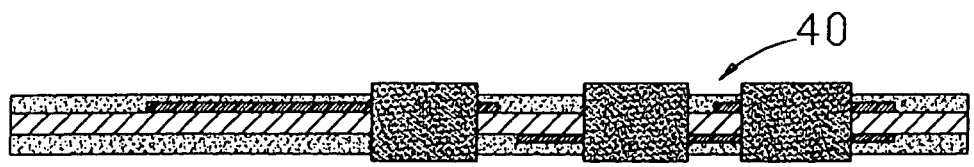
FIGS. 6A~6C are illustrative views of an 8-layer printed circuit board manufacturing procedure according to a second preferred embodiment of the present invention.
Figure 6B:
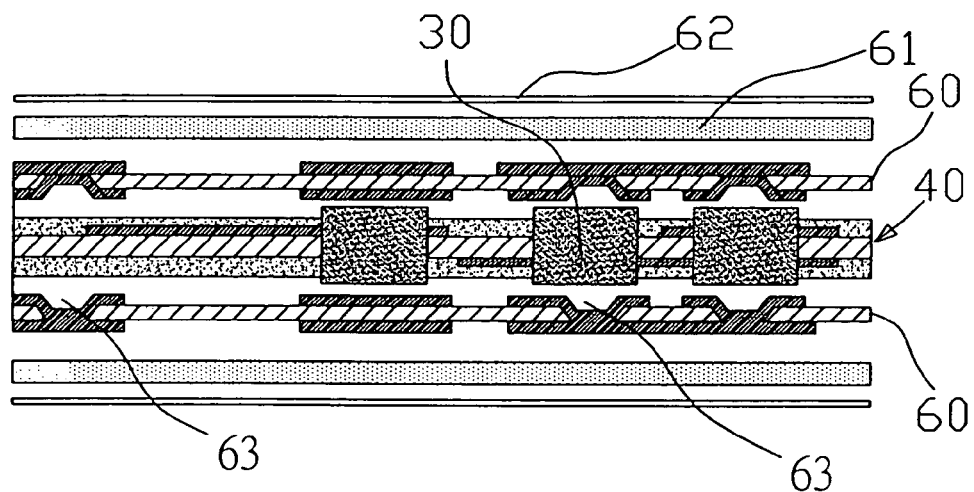
Figure 6C:
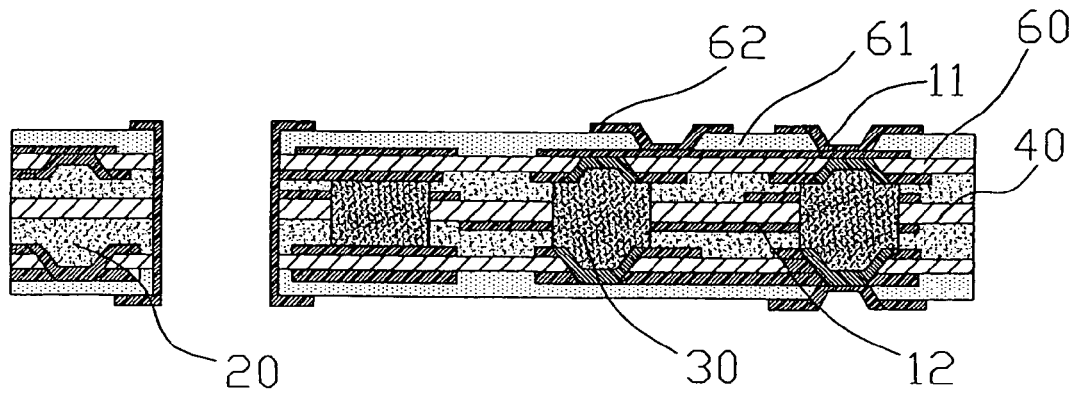

Please refer to FIGS. 6A to 6C for illustrative views of an 8-layer printed circuit board manufacturing procedure according to another preferred embodiment of the present invention. To stack the circuit board component 60 having blind vias and double-sided circuits (produced by the same manufacturing method as the circuit board component 50) onto both the upper and lower sides of a basic component; stacking the dielectric material 61 such as a resin-impregnated fiberglass fabric or a resin-impregnated short-fiber polyamide mat onto the circuit board 60 and then stacking the copper clad 62 on the surface of the dielectric material 61. In the meantime, align the blind vias 63 of the circuit board component 60 needs to interconnect with the buried vias of the basic component 40 (as shown in FIGS. 6A and 6B), since the plastic conductive material 30 is slightly protruded from the opening of the via after the coversheet on the surface of the dry film dielectric is removed, therefore the plastic conductive material 30 will fill up the blind vias 63 when carrying out the heating and pressurization process. After the pressing process is completed, the mechanical drilling, laser drilling, via filled plating are performed to produce the via interconnection, then photolithography and etching processes are performed to produce the outermost electric circuit, such the required 8-layer circuit board having blind and buried vias structure is completed (as shown in FIG. 6C).

Figure 7A:
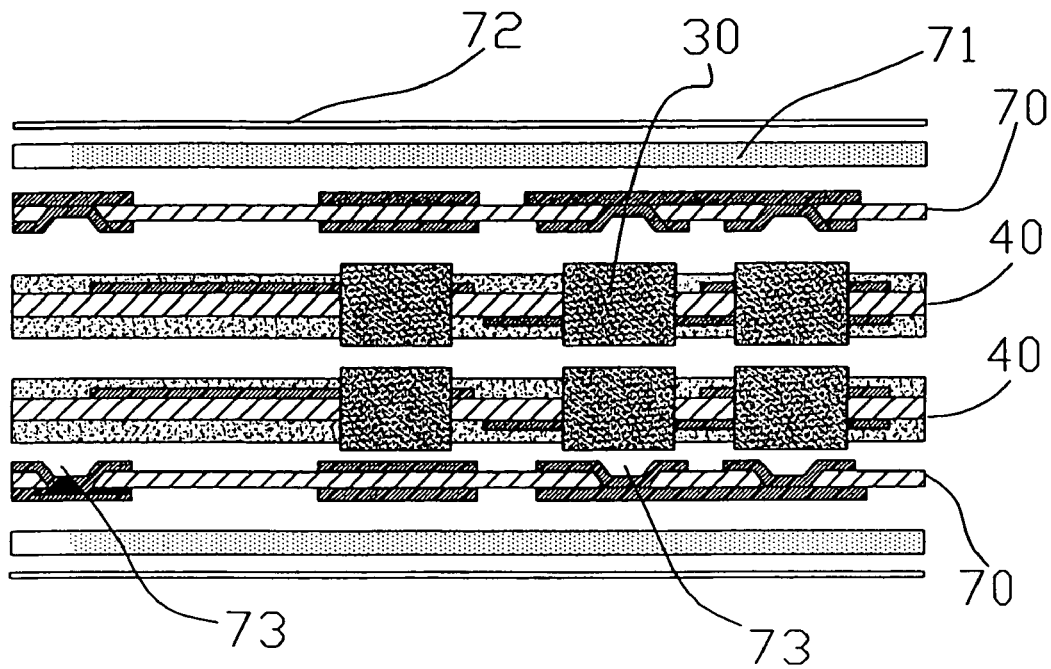
FIGS. 7A~7B are illustrative views of a 10-layer printed circuit board manufacturing procedure according to a third preferred embodiment of the present invention.
Figure 7B:
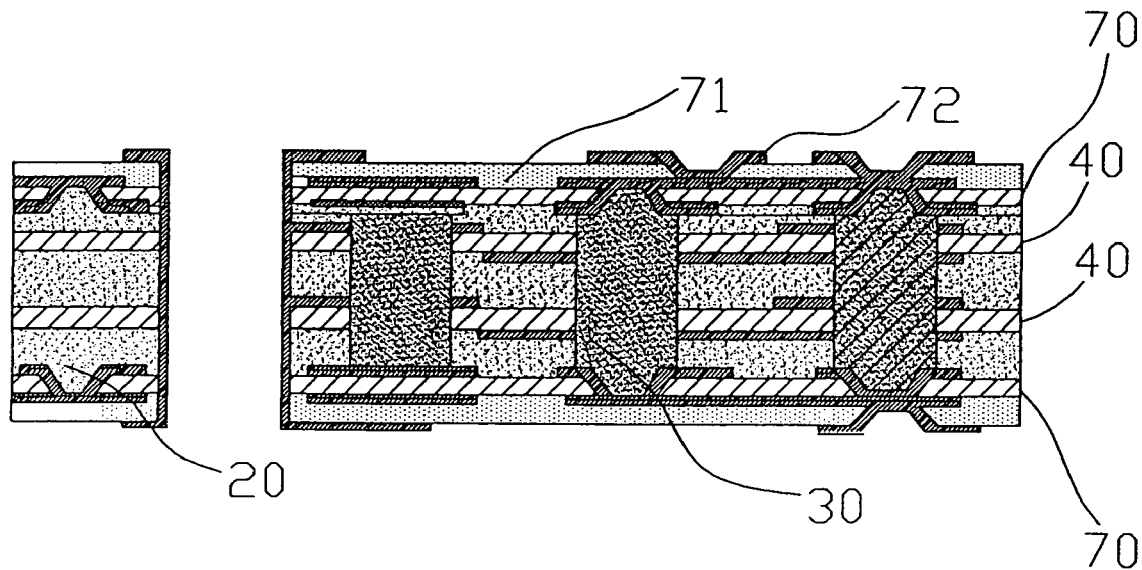

Please refer to FIGS. 7A and 7B for the illustrative views of a 10-layer printed circuit board manufacturing procedure by using a basic component 40 to produce a 10-layer circuit board having the blind and buried via structure according to the present invention. To stack two basic components 40; stacking the circuit board component 70 having blind vias and double-sided circuits (produced by the same manufacturing method as the circuit board component 50) onto both the upper and lower sides of the two mutually stacked basic component; stacking the dielectric material 71 such as a resin-impregnated fiberglass fabric or a resin-impregnated short-fiber polyamide mat onto the circuit board 70 and then stacking the copper clad 72 on the surface of the dielectric material 61. In the meantime, align the blind vias 73 of the circuit board component 70 needs to interconnect with the buried vias of the basic component 40 (as shown in FIGS. 7A), since the plastic conductive material 30 is slightly protruded from the opening of the via after the coversheet on the surface of the dry film dielectric is removed, therefore the plastic conductive material 30 will fill up the blind vias 73 when carrying out the heating and pressurization process. After the pressing process is completed, the mechanical drilling, laser drilling, via filled plating are performed to produce the via interconnection, then photolithography and etching processes are performed to produce the outermost electric circuit, such the required 10-layer circuit board having blind and buried vias structure is completed (as shown in FIG. 7B).

Figure 8A:
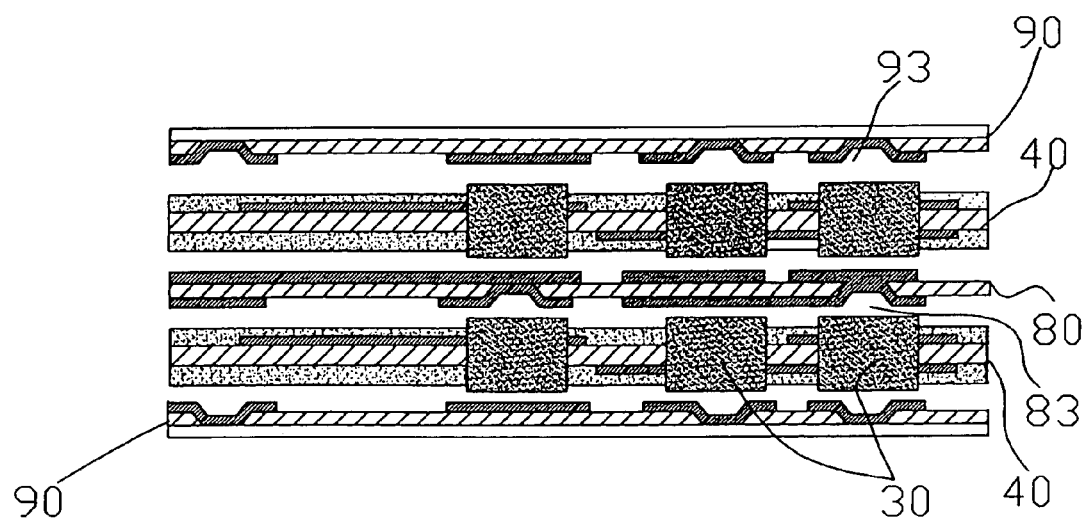
FIGS. 8A~8B are illustrative views of a 10-layer printed circuit board another manufacturing procedure according to a fourth preferred embodiment of the present invention.
Figure 8B:
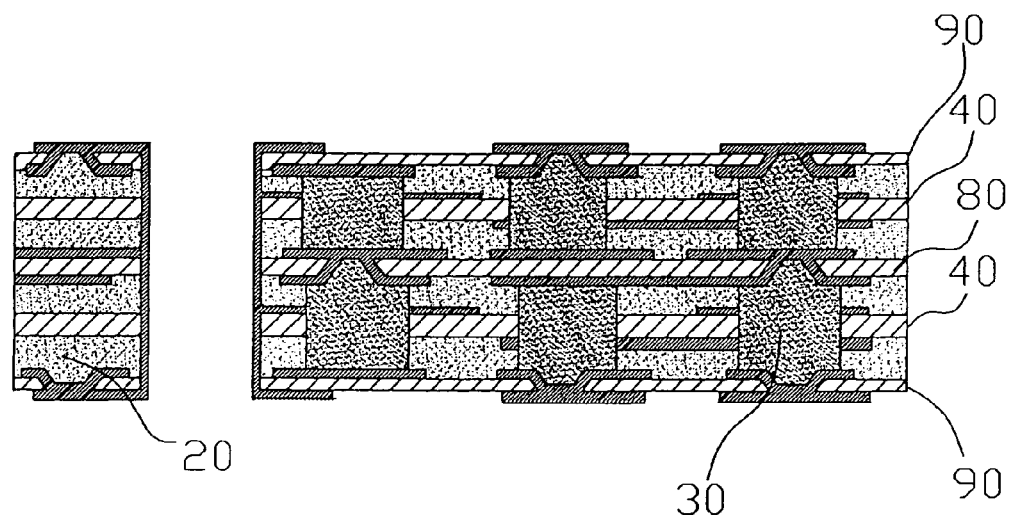

Please refer to FIGS. 8A and 8B for another method of manufacturing a 10-layer circuit board having blind and buried vias structure by using a basic component 40. First, the circuit board component 80 having blind vias and double-sided circuits (produced by the same manufacturing method as the circuit board component 50) being held between the two basic components 40; then stacking the produced circuit board component 90 having blind vias and single-sided circuit (produced by the same manufacturing method as the circuit board component 50) onto the two basic components 40 at the side not adjacent to the circuit board component 80. In the meantime, align the blind vias 83,93 of the circuit board component 80,90 needs to interconnect with the buried vias of the basic component 40 (as shown in FIGS. 8A), since the plastic conductive material 30 is slightly protruded from the opening of the via after the coversheet on the surface of the dry film dielectric is removed, therefore the plastic conductive material 30 will fill up the blind vias 83,93 when carrying out the heating and pressurization process. After the pressing process is completed, the mechanical drilling and plating are performed to produce the via interconnection, and produce the outmost electric circuit by the photolithography and etching methods, such the required 10-layer circuit board having blind and buried vias structure is completed (as shown in FIG. 8B).

In view of the foregoing embodiment described above, a printed circuit board with more layers can be produced just perform once heating and pressurization by using the basic components, the produced circuit board components with blind vias and single-sided circuit or double-sided circuit and the combination of dielectric material and copper clad. (To simplify the description, a dielectric material and a copper clad are adopted in the embodiment. However, in actual practice, the prior-art build up material of the resin coated copper (RCC) can be used to substitute the dielectric material and copper clad for the pressing). The quantity of the basic components and circuit board components used for assembling is the main difference of the application according to different structure of circuit board. In summary, whatever layer counts of multilayer circuit board having blind and buried vias structure could be made by two ways of the present invention, one is circuit boards having blind vias and single-side or double-sided circuits to be stacked with each basic component, the other is circuit boards having blind vias and single-sided or double-sided circuits to be stacked with components which having at least two basic components mutually stacked together, comprise the dielectric material and copper clad according to the multilayer circuit board mode, then perform once heating and pressurization process and the follow-up mechanical drilling, laser drilling, photolithography and etching operations.

It is noteworthy that when the B-stage dry film dielectric of the basic component disclosed in the foregoing preferred embodiments is pressed onto a laminate by a dry film lamination method, the dielectric resin still remains at the B-stage since the dry film pressure is controlled below the glass conversion temperature (Tg) of the resin. Therefore, the resin could be softened again and can be attached onto the metal or dielectric material of the circuit board components having blind vias and single-sided or double-sided circuit during the heating and pressurization process.

Unlike another prior-art technology, this feature is generally used for manufacturing circuit boards with the specification of a very fine circuit (50 µm) and space (50 µm) between circuits. Such method for manufacturing fine circuits also uses a dry film dielectric as the dielectric material for building up the layers of the circuit board, and controls the temperature of for the dry film lamination above the temperature of glass conversion temperature (Tg) of the resin, so that the dielectric resin is converted into the C-stage. (The stage for the resin to reach the glass conversion temperature. The resin is hardened completely once it reaches C-stage, and cannot be softened or have the adhesive action with any metal or dielectric material of the circuit board by applying whatever temperature.) The follow-up drilling, electroless plating, photoresist masking and lithography, plating and photoresist removal operations are performed to produce via interconnection and electric circuits as the core circuit boards for building up layers.

The general pressing method used a copper clad as the substrate for etching electric circuits is limited by the etching factor and cannot produce a very fine circuit (50 µm) and a short space (50 µm) between circuits, but the method of manufacturing an electric circuit by converting dry film dielectric into the C-stage after dry film lamination could overcome this problem. Using the dry film dielectric technology to produce electric circuit is by plating method and isn't by etching as the prior-art technology, due to no etching factor issue and thus can produce a very fine circuit.

On present invention, since dry film dielectric of the basic component must be softened again and have the adhesive action with metal or dielectric material of the circuit board component, therefore the dry film pressure is controlled below the glass conversion temperature (Tg) of the resin when the dry film is pressed on the laminate by the dry film lamination method enable the dielectric resin still remains at the B-stage and has the adhesive actions of attaching a metal or dielectric material of the circuit board component. Thus the application and purpose of using the dry film dielectric are different between the present invention and the prior-art technology which is aimed at fine circuit PCB (Printed circuit board).

From the aforementioned pressing method, it is obvious that the present invention has the following advantages:

1. Whatever layer counts of multilayer circuit board having blind and buried vias structure, just only once heating and pressurization process is needed to complete the manufacture. The present invention can reduce the times of the heating and pressurization processes. (The prior-art technology requires at least two times of heating and pressurization processes depending on the layer counts of the circuit board structure, and each time takes about 4~5 hours).

2. The present invention provides an excellent alignment; since it only needs to go through the pressing process for one time, therefore the confirmation of the alignment between each circuit layer and its next layer can be done at one time to avoid a serious deviated alignment between the circuit layers caused by too many times of pressings.

3. The present invention does not need the special and high cost chemical solution to perform via-filled plating. The present invention directly fills plastic conductive material from the vias of basic components into the blind vias of circuit boards having blind vias and single-sided or double-sided circuits to achieve the same effect as the via-filled plating, and save much time and cost.

4. Unlike the prior-art technology that needs to make the circuit board layer by layer, continuously repeat build up process from the inner layers to the outer layers (heating and pressurization, mechanical drilling, laser drilling, via-filled plating . . . etc.), the present invention separately manufacture the basic components and the circuit boards having blind vias and single-sided or double-sided circuits then select the good ones to perform once heating and pressurization. So the present invention not only save the overall manufacturing time, but also enhance the yield rate and lower the cost of fault at a later stage of the manufacturing process.

In summation of the description above, the modular method for manufacturing circuit boards, which is a method of manufacturing multilayer printed circuit boards with blind and buried vias structure by using basic components as the assembly units according to the present invention overcomes the shortcomings of the prior-art technology and enhances the performance, further complies with the patent application requirements and is submitted to the Patent and Trademark Office for review and granting of the commensurate patent rights.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements.

What is claimed is:

1. A modular method for manufacturing circuit board, being a method of manufacturing a multilayer circuit board with blind and buried vias structure by using a basic component as the assembling unit and comprising:

producing an electric circuit layer on the surface of a copper clad laminate by photolithography and etching method;

pressing a B-stage dry film dielectric onto said electric circuit layer on the surface of said laminate by a dry film lamination method;

drilling vias at appropriate position that requires electric interconnection by a mechanical drilling method;

filling plastic conductive material into said vias; and removing the coversheet from the surface of said dry film dielectric, thereby said plastic conductive material being slightly protruded from the opening of said vias to define a basic component.

2. The modular method for manufacturing circuit board of claim 1, wherein said dry film lamination method adopts a hot roller laminator for the operation of pressing said dry film dielectric onto said electric circuit layer on the surface of said laminate.

3. The modular method for manufacturing circuit board of claim 1, wherein said dry film lamination method adopts a vacuum laminator for the operation of pressing said dry film dielectric onto said electric circuit layer on the surface of said laminate.

4. The modular method for manufacturing circuit board of claim 1, wherein said dry film lamination method controls dry film lamination temperature below dry film dielectric glass conversion temperature, so that said dry film dielectric remains in B-stage after pressing said dry film dielectric onto said electric circuit layer on the surface of said laminate.

5. The modular method for manufacturing circuit board of claim 1, wherein said plastic conductive material is a copper paste.

6. The modular method for manufacturing circuit board of claim 1, wherein said plastic conductive material is a silver paste.

7. The modular method for manufacturing circuit board of claim 1, wherein said plastic conductive material is a mixture of silver and copper.

8. A modular method for manufacturing circuit board, comprising the steps of:

producing an electric circuit layer on the surface of a copper clad laminate by photolithography and etching method;

pressing a B-stage dry film dielectric onto said electric circuit layer on the surface of said laminate by a dry film lamination method;

drilling vias at appropriate position that requires electric interconnection by a mechanical drilling method;

filling plastic conductive material into said vias; and removing the coversheet from the surface of said dry film dielectric, thereby said plastic conductive material being slightly protruded from the opening of said vias to define a basic component;

thereby produced blind via, single-sided circuit board and produced blind via, double-sided circuit board adjacent stack with each said of basic component, and said blind via of said circuit board interconnected with said via of said basic components align with their corresponding positions for once heating and pressurization procedure, such that said plastic conductive material being slightly protruded from the opening of said via and filling said blind via, and then produce the via interconnection and photolithography by mechanical drilling, laser drilling and plating, and produce the outermost electric circuit by etching processes to form a multilayer circuit board with blind and buried vias structure.

9. The modular method for manufacturing circuit board of claim 8, wherein said dry film lamination method adopts a hot roller laminator for the operation of pressing said dry film dielectric onto said electric circuit layer on the surface of said laminate.

10. The modular method for manufacturing circuit board of claim 8, wherein said dry film lamination method adopts a vacuum laminator for the operation of pressing said dry film dielectric onto said electric circuit layer on the surface of said laminate.

11. The modular method for manufacturing circuit board of claim 8, wherein said dry film lamination method controls dry film lamination temperature below dry film dielectric glass conversion temperature, so that said dry film dielectric remains in B-stage after pressing said dry film dielectric onto said electric circuit layer on the surface of said laminate.

12. The modular method for manufacturing circuit board of claim 8, wherein said plastic conductive material is a copper paste.

13. The modular method for manufacturing circuit board of claim 8, wherein said plastic conductive material is a silver paste.

14. The modular method for manufacturing circuit board of claim 8, wherein said plastic conductive material is a mixture of silver and copper.

15. A modular method for manufacturing circuit board, comprising the steps of:

producing an electric circuit layer on the surface of a copper clad laminate by photolithography and etching method;

pressing a B-stage dry film dielectric onto said electric circuit layer on the surface of said laminate by a dry film lamination method;

drilling vias at appropriate position that requires electric interconnection by a mechanical drilling method;

filling plastic conductive material into said vias; and removing the coversheet from the surface of said dry film dielectric, thereby said plastic conductive material being slightly protruded from the opening of said vias to define a basic component;

thereby produced blind via, single-sided circuit board and produced blind via, double-sided circuit board adjacent stack with each said of at least two mutually stacked basic components, and said blind via of said circuit board interconnected with said via of said basic components align with their corresponding positions for once heating and pressurization procedure, such that said plastic conductive material being slightly protruded from the opening of said via and filling said blind via, and then produce the via interconnection and photolithography by mechanical drilling, laser drilling and plating, and produce the outermost electric circuit by etching processes to form a multilayer circuit board with blind and buried vias structure;

with, required blind and buried via structure.

16. The modular method for manufacturing circuit board of claim 15, wherein said dry film lamination method adopts a hot roller laminator for the operation of pressing said dry film dielectric onto said electric circuit layer on the surface of said laminate.

17. The modular method for manufacturing circuit board of claim 15, wherein said dry film lamination method adopts a vacuum laminator for the operation of pressing said dry film dielectric onto said electric circuit layer on the surface of said laminate.

18. The modular method for manufacturing circuit board of claim 15, wherein said dry film lamination method controls dry film lamination temperature below dry film dielectric glass conversion temperature, so that said dry film dielectric remains in B-stage after pressing said dry film dielectric onto said electric circuit layer on the surface of said laminate.

19. The modular method for manufacturing circuit board of claim 15, wherein said plastic conductive material is a copper paste.

20. The modular method for manufacturing circuit board of claim 15, wherein said plastic conductive material is a silver paste.

21. The modular method for manufacturing circuit board of claim 15, wherein said plastic conductive material is a mixture of silver and copper.

* * * * *